Dec. 19, 1967 A. E. WITTMANN 3,359,132

METHOD OF COATING CIRCUIT PATHS ON PRINTED CIRCUIT BOARDS WITH SOLDER

Filed July 10, 1964

INVENTOR.
ALBIN E. WITTMANN

BY G. McCoy
George P. Chandler
ATTORNEYS

United States Patent Office 3,359,132
Patented Dec. 19, 1967

3,359,132
METHOD OF COATING CIRCUIT PATHS ON PRINTED CIRCUIT BOARDS WITH SOLDER

Albin E. Wittmann, Huntsville, Ala., assignor to the United States of America as represented by the National Aeronautics and Space Administration Filed July 10, 1964, Ser. No. 381,940
10 Claims. (Cl. 117—212)

ABSTRACT OF THE DISCLOSURE

A method of coating copper circuit paths on printed circuit boards to prevent oxidation. A printed circuit board is held above a bath of molten solder and flux is applied. The board is then submerged in the bath for a short period of time, withdrawn and spun rapidly to remove excess solder. A smooth, uniform coating is obtained, and an intermetallic compound is formed at the interface, ensuring maximum adhesion of the coating.

Figure 1:
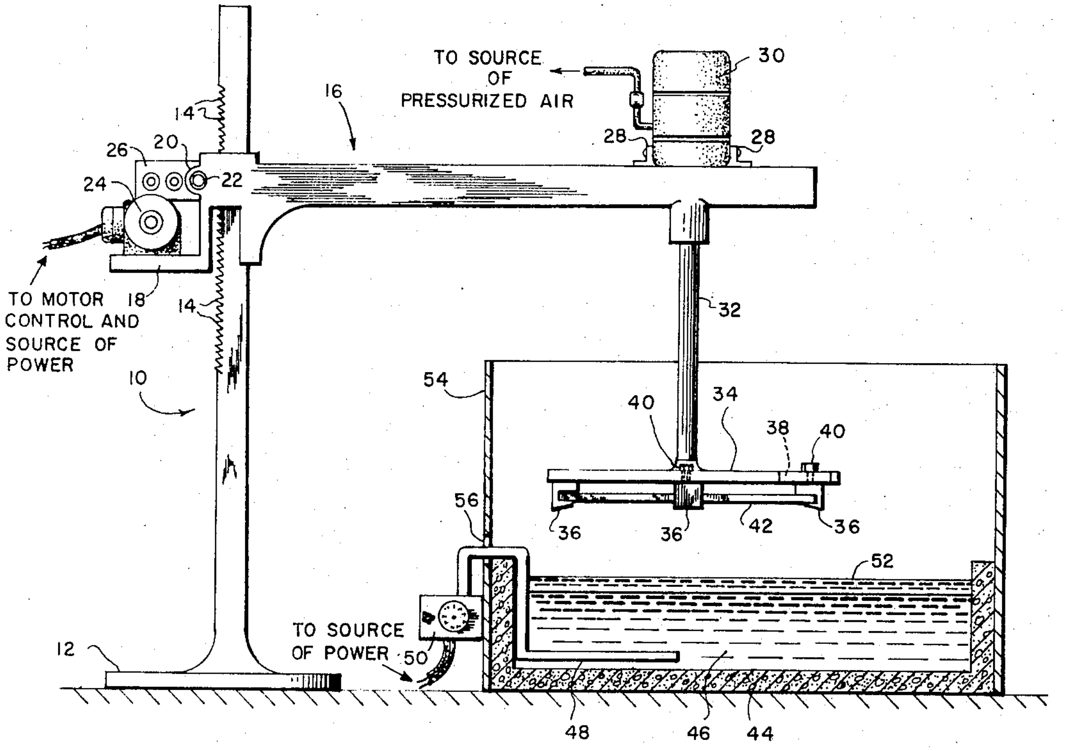

The invention described herein may be manufactured and used by or for the Government of the United States of America for government purposes without the payment of any royalties thereon or therefor.

This invention relates to a method for the surface coating of articles with solder of a controlled thickness and uniformity. More particularly this invention relates to a method for coating circuit paths of a printed circuit board by dipping the board into a bath of molten solder, removing it from the bath, and subjecting it to a controlled spinning motion to remove excess solder.

A persistent and long standing problem in the art of manufacturing printed or etched circuit boards results from the fact that oxidation of the copper circuit paths commences the moment they are exposed to the atmosphere. Obviously such is highly undesirable in that it leads to very difficult manufacturing problems such as short storage life and poor, weak, unreliable connections between the circuit path and the mounted electronic components. Short storage life results in high inventory costs while the lack of reliable connections gives rise to obvious disadvantages.

A common method for preventing oxidation of copper circuit paths on printed circuit boards is electro-plating with gold. While such an expedient does offer some protection against corrosion, it is subject to several very serious drawbacks in addition to the evident high cost. For example, the quality of the plating is directly related to the dependability of the operator, and is dependent on such factors as cleanliness, current, temperature, time, etc. Furthermore, no accurate prediction can be made of the existence of oxidation and impurities between the plating and base material. Obviously, any point where oxidation occurs is a "weak link" subject to physical or electrical breakdown which will incapacitate the circuit.

Another undesirable result of gold plating arises from the behavior of the gold (with a melting point of 1940° F.) going into solution with molten solder. This phenomenon leads to two very undesirable conditions. Namely; (1) the gold will be absorbed by the tin of the molten solder compound leaving the oxidation problem unresolved, and (2) oxidation and/or the alloy formed by the solder-gold combination results in under-strength solder joints.

In order to alleviate some of the disadvantages of gold plating, a solder coating has been utilized. To obtain such a coating, a circuit board is dipped into a bath of molten solder, withdrawn and allowed to cool. Oftentimes the board is mechanically or hand slung as it is withdrawn from the bath. This method, however, also produces unsatisfactory results in that the resulting coating generally is rough, with a wavy surface, and is not of uniform thickness.

The above enumerated disadvantages of both the gold and solder coatings have been overcome by the vastly superior method of coating that is the subject of this application and which is accomplished in the following manner. A printed circuit board is held above a bath of molten solder having a thin layer of oil floating thereon. Flux is applied to the board which is then pre-heated by holding it close to the surface of the hot oil. The board is then submerged in the molten solder, withdrawn, and spun. The spinning action clears the solder from the component securing holes on the circuit board and removes excess solder from the circuit paths leaving a complete, uniform, and smooth finish.

Several advantages result from the use of the dip and spin method in addition to the uniform smooth finish. For one, the thickness of the coating can be controlled by varying the spinning speed and hence the amount of solder removed. Also, the spinning action promotes a rapid cooling of the circuit board which reduces the surface tension of the solder coating which, as is well known in the art is very desirable. Furthermore, a new intermetallic compound of uniform thickness is produced at the interface consisting of the copper of the circuit path and the solder alloy. This alloy is highly desirable in that it insures maximum adhesion between the solder and the copper circuit path.

Perhaps one of the most important advantages resulting from the dip and spin method of solder coating is the quality control factor which is introduced. If there is a corroded spot on the circuit path before coating, the solder will be cast from that point by the spinning action since there is no adhesion between the products of corrosion and the solder. Such bare spots can be easily detected and corrective action taken.

Accordingly, it is an object of this invention to provide a method for coating circuit paths of printed circuit boards with solder.

It is another object of the invention to provide a method for coating the circuit paths of printed circuits in such a manner as to provide a uniform, smooth protective layer.

Yet another object of the invention is the utilization of a method for solder coating circuit paths on printed circuit boards in which the solder is removed from soiled or corroded spots.

Still another object of the invention is to provide a method for coating the circuit paths on printed circuit boards in which rapid cooling of the board is effected.

Another object of the invention is to provide a method for coating circuit paths on printed circuit boards in which an alloy of the material of the path and the solder is produced at the interface between them.

Figure 2:
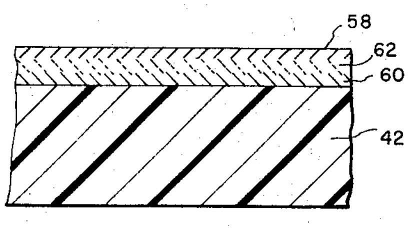

These and other objects and advantages of this invention will be more apparent upon reference to the following specification, appended claims, and drawings wherein:

FIGURE 1 is a side elevational view, partly in section, of apparatus utilized in carrying out the dip and spin method of solder coating which is the subject matter of the present invention; and FIGURE 2 illustrates a broken out portion, in section of a circuit board having a copper circuit path thereon, a solder coating on the circuit path, and a solder and copper alloy interface.

In order to better understand this novel method of coating it will be described in relation to the depositing of a layer of solder on the circuit paths of a printed circuit board. It is to be understood, however, that various other uses may be found for this novel method. For example, it could be used to deposit a uniform layer of paint or a thermo-setting plastic on articles where such is deemed desirable. Other uses will be readily apparent to those skilled in the art.

With continued reference to the accompanying figures wherein like numerals designate similar parts throughout the various views, and with initial attention directed to FIGURE 1, reference 10 designates an upright standard including a base 12 at its lower end and a plurality of gear teeth 14 formed along one of its sides. A horizontal mounting arm 16 is slidably secured to the standard and includes a motor mounting shelf 18 and mounting ears 20 disposed on either side of the standard 12 to which a shaft 22 is rotatably secured. A motor 24 is secured to the shelf 18 and drives a gear (not shown) mounted on the shaft 22 through the gear box 26. The teeth of the gear mounted on the shaft 22 mesh with the teeth 14.

A pair of brackets 28 are mounted on the end of the mounting arm 16 at a point remote from the standard 10 and serve to secure a motor 30 to the arm. This motor may be of any type which will produce a rotary output motion, but is preferably a pneumatic motor providing a high starting torque.

Depending from the motor 30 is an output shaft 32 having a mounting plate 34 secured to its lower end. A plurality of circuit board holders 36 and 36' are secured along the periphery of the mounting plate 34. Slots 38 in the plate 34 accommodate bolts 40 which are threaded into the circuit board holders 36' so as to provide an adjustment that will allow circuit boards 43 of different sizes to be held in position. These adjustable circuit board holders also are moved outwardly to allow insertion and removal of the boards 42.

An open top container 44 constructed of a suitable insulating material, is positioned immediately beneath the mounting plate 34. A quantity of molten solder 56 is held in the container 44 and maintained in a liquid state by a heating element 48. The temperature of the heating element, and hence the molten solder 46, is controlled by a variable thermostat 50.

Floating on the surface of the molten solder 46 is a layer of peanut oil 52 which is used to reduce the surface tension of the molten solder and to provide a barrier to air to prevent oxidation of the copper during the coating process. A shield 54 extends above and encloses the container 44 to prevent spreading of molten solder during the spin cycle. An aperture 56 in the shield 54 provides an entrance way for the heating element 48.

While not shown it is obvious that motors 24 and 30 can be controlled either manually or on an automatic cycle. If the latter system is used, the motors will be interlocked by a series of suitable valves and time controlled switches.

*The method*

In operation, after a circuit board 42 to which flux has been applied has been securely fastened to the mounting plate 34 by means of circuit board holders 36 and 36', the motor 24 is actuated to drive the gear mounted on shaft 22 in such a manner that the horizontal arm 16 is lowered. The motor 24 is stopped when the circuit board 42 is disposed in close proximity to a layer of oil 52 which is resistant to high temperature such as, for example, peanut oil. The board is held in this position and slowly spun for a short period of time until it is sufficiently heated. The slow spin of the board is halted and it is then submerged in the molten solder for a predetermined time before being withdrawn by reversing motor 24. As the board emerges from the oil film 52, it is immediately spun to both remove excess solder and to provide for rapid cooling.

Obviously many combinations of times and spinning speeds for the various cycles of this operation may be used. Satisfactory results, however, have been obtained by holding the circuit board about one inch above the surface of the peanut oil for approximately 5 seconds to accomplish preheating. A submersion time of 1–3 seconds and a spinning speed of 1200–1800 r.p.m. held for 1 or 2 seconds produces a smooth uniform finish. Of course, the spinning speed is limited by the ability of the board to withstand centrifugal forces and the finish and thickness of coating desired. A solder having a composition of 60% tin and 40% lead maintained at a temperature of 500° F. has been found to produce excellent results.

As best shown in FIGURE 2, an alloy 62 which is believed to consist of $Cu_6Sn_5$, is formed at the interface between the copper circuit path 58 and the solder coating 60. This formation is highly desirable in that it increases the adhesion between these two layers. This alloy layer is uniform and contains no corroded spots due to the rapid cooling and uniform dispersion produced by the spin cycle.

It will be apparent that by utilizing the teachings of this invention, a coating which is uniform in thickness and in finish can be produced. The thickness of the coating is controlled by varying the spinning speeds. The rapidity of the spin produces a cooling effect which eliminates the possibility of corrosion spots on the interface between the cooper circuit path and the coating. If there is a previously existing corroded spot on a circuit path, the solder will be cast from that point by the centrifugal force and, therefore, the circuit boards will be of a uniformly high quality. Such has not been heretofore possible in existing methods of coating which produced bare spots subject to corrosion, and very rough finishes. Circuit boards coated by utilizing the method which is the subject of this invention, may be stored many months and will provide for strong and reliable connections with components mounted on the board.

The invention may be embodied in other specific forms without departing from the spirit or essential characteristics thereof. The present embodiment is therefore to be considered in all respect as illustrative and not restrictive, the scope of the invention being dictated by the appended claims rather than by the foregoing description, and all changes which come within the meaning and range of equivalency of the claims are therefore intended to be embraced therein.

What is claimed and desired to be secured by United States Letters Patent is:

1. The method of coating the circuit paths of a printed circuit board with solder comprising:
(a) positioning said circuit board in a holder;
(b) lowering said holder and said circuit board into a bath of molten solder;
(c) allowing said holder and said circuit board to dwell in said bath for a short period of time whereby an intermetallic bond between said circuit paths and said coating is produced; and
(d) spinning said holder and circuit board immediately upon withdrawal to remove excess solder from said circuit board to thereby produce a coating on said circuit board having a uniformly smooth finish and the desired thickness.

2. The method of claim 1 wherein flux is applied to said circuit board before lowering said circuit board into said bath of molten solder.

3. A method according to claim 1 wherein said holder and said circuit board are held above said molten bath before lowering whereby said circuit board is preheated.

4. A method according to claim 3 wherein said holder and said circuit board are slowly rotated during the preheating cycle.

5. The method of coating the circuit paths of a printed circuit board with solder comprising:
(a) positioning said circuit board in a holder;
(b) lowering said holder and said circuit board to a point just above a bath of molten solder and holding said holder and said circuit board above said molten bath for approximately 5 seconds;
(c) lowering said holder and said circuit board into said molten bath;

(d) allowing said holder and said circuit board to dwell in said bath for a short period of time whereby a intermetallic bond between said circuit paths and said coating is produced;

(e) withdrawing said holder and circuit board from said bath; and (f) spinning said holder and circuit board immediately upon withdrawal to remove excess solder from said circuit board to thereby produce a coating on said circuit board having a uniformly smooth finish and the desired thickness.

6. The method of claim 5 wherein flux is applied to said circuit board before lowering said circuit board into said bath of molten solder.

7. A method according to claim 5 wherein said holder and said circuit board are slowly rotated during the preheating cycle.

8. A method according to claim 5 wherein said holder and said circuit board are allowed to dwell in said bath for from 1 to 3 seconds.

9. A method according to claim 5 wherein said holder and circuit board are spun at a speed of from 1200 to 1800 r.p.m. immediately upon withdrawal from said molten bath.

10. The method of coating the circuit paths of a printed circuit board with solder comprising the steps of:

(a) positioning said circuit board in a holder;

(b) lowering said holder and said circuit board to a point approximately 1 inch above the surface of a bath of molten solder;

(c) slowly rotating said holder and said circuit board for approximately five seconds as they are held above said molten bath;

(d) lowering said holder and said circuit board into said bath of molten solder;

(e) allowing said holder and said circuit board to dwell in said bath for from 1 to 3 seconds whereby an intermetallic bond between said circuit paths and said coating is produced;

(f) withdrawing said holder and circuit board from said bath; and (g) spinning said holder and circuit board immediately upon withdrawal at a speed of from 1200 to 1800 r.p.m. for approximately 1 to 2 seconds to remove excess solder from said circuit board to thereby produce a coating on said circuit board having a uniformly smooth finish and the desired thickness.

References Cited

UNITED STATES PATENTS 2,273,250 2/1942 Charlton ---------- 117—101
3,200,788 8/1965 Tardoskegyu --------- 228—36

WILLIAM L. JARVIS, *Primary Examiner.*